(12) United States Patent
Xu et al.

(10) Patent No.: US 10,944,075 B2
(45) Date of Patent: Mar. 9, 2021

(54) DISPLAY PANELS, METHODS OF MANUFACTURING THE SAME, AND DISPLAY TERMINALS

(71) Applicant: YUNGU (GU'AN) TECHNOLOGY CO., LTD., Langfang (CN)

(72) Inventors: Peng Xu, Kunshan (CN); Yun Cheng, Kunshan (CN); Lufangyue Ji, Kunshan (CN); Tongkai Zhou, Kunshan (CN); Wei Du, Kunshan (CN); Gang Cen, Kunshan (CN)

(*) Notice: Subject to any disclaimer, the term of this patent is extended or adjusted under 35 U.S.C. 154(b) by 0 days.

(21) Appl. No.: 16/701,167

(22) Filed: Dec. 3, 2019

(65) Prior Publication Data

US 2020/0106048 A1 Apr. 2, 2020

Related U.S. Application Data

(63) Continuation of application No. PCT/CN2019/084859, filed on Apr. 28, 2019.

(30) Foreign Application Priority Data

Jul. 5, 2018 (CN) .......................... 201810730611.X

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3211* (2013.01); *H01L 27/3246* (2013.01);
(Continued)

(58) Field of Classification Search
None
See application file for complete search history.

(56) References Cited

U.S. PATENT DOCUMENTS

| 2011/0001146 A1 | 1/2011 | Yamazaki et al. |
| 2017/0084675 A1 | 3/2017 | Yoon et al. |

(Continued)

FOREIGN PATENT DOCUMENTS

| CN | 104425550 A | 3/2015 |
| CN | 106783881 A | 5/2017 |

(Continued)

OTHER PUBLICATIONS

CN First Office Action dated Apr. 14, 2020 in the corresponding CN application (application No. 201710730611.X).
(Continued)

*Primary Examiner* — Evren Seven
(74) *Attorney, Agent, or Firm* — Kilpatrick Townsend & Stockton

(57) ABSTRACT

The present disclosure relates to a display panel, a manufacturing method thereof, and a display terminal. The display panel includes an interlayer insulating layer, a planarization layer, and a pixel defining layer stacked in sequence. The display panel further includes a sub-pixel, a cathode, and a thin film encapsulation structure. The pixel defining layer is provided with an opening. The sub-pixel is disposed in the opening of the pixel defining layer, and the cathode is disposed on the pixel defining layer and covers the sub-pixel. The thin film encapsulation structure is disposed on the cathode, and the thin film encapsulation structure or the cathode is provided with a first embedded portion. The first embedded portion is embedded in the pixel defining layer and the planarization layer, and is in contact with the interlayer insulating layer.

20 Claims, 5 Drawing Sheets

(51) Int. Cl.
*H01L 51/56* (2006.01)
*H01L 51/00* (2006.01)

(52) U.S. Cl.
CPC .......... *H01L 27/3258* (2013.01); *H01L 51/56* (2013.01); *H01L 51/0008* (2013.01); *H01L 2227/323* (2013.01)

(56) References Cited

U.S. PATENT DOCUMENTS

| | | | |
|---|---|---|---|
| 2017/0148861 A1 | 5/2017 | Kim | |
| 2017/0317154 A1* | 11/2017 | Heo | H01L 27/3262 |
| 2018/0033829 A1* | 2/2018 | Oh | G06F 3/0446 |
| 2018/0124933 A1* | 5/2018 | Park | H01L 51/5212 |
| 2018/0138251 A1* | 5/2018 | Kang | H01L 27/3276 |
| 2019/0074339 A1* | 3/2019 | Ma | H01L 27/3258 |
| 2019/0165312 A1* | 5/2019 | Bae | H01L 27/3258 |
| 2020/0006458 A1* | 1/2020 | Lim | H01L 27/3246 |
| 2020/0144344 A1* | 5/2020 | Wang | H01L 27/326 |
| 2020/0194518 A1* | 6/2020 | Myung | H01L 27/3246 |

FOREIGN PATENT DOCUMENTS

| | | |
|---|---|---|
| CN | 106783911 A | 5/2017 |
| CN | 107240596 A | 10/2017 |
| CN | 108039356 A | 5/2018 |
| CN | 108039418 A | 5/2018 |
| CN | 108735791 A | 11/2018 |

OTHER PUBLICATIONS

Office Action of Chinese Patent Application No. 201810730611.X.
International Search Report of PCT/CN2019/084859.

* cited by examiner

DISPLAY PANELS, METHODS OF MANUFACTURING THE SAME, AND DISPLAY TERMINALS

CROSS REFERENCES TO RELATED APPLICATIONS

This application is a continuation application of International Application PCT/CN2019/084859, filed on Apr. 28, 2019, which claims the priority benefit of Chinese Patent Application No. 201810730611.X, titled "DISPLAY PANELS, METHODS OF MANUFACTURING THE SAME, AND DISPLAY TERMINALS" and filed on Jul. 5, 2018. The entireties of these applications are incorporated by reference herein for all purposes.

TECHNICAL FIELD

The present disclosure relates to the field of display device technologies.

BACKGROUND

Organic Light-Emitting Diode (OLED) is increasingly widely applied to intelligent terminal products such as mobile phones, tablet computers, and even televisions. However, conventional OLED display devices have been inadequate. New and improved OLED display devices are desired.

SUMMARY

Based on this, with respect to the problem that the OLED display device has poor impact resistance, it is necessary to provide a display panel, a method of manufacturing the same, and a display terminal to solve the aforementioned problem.

A display panel includes an interlayer insulating layer, a planarization layer, and a pixel defining layer. The interlayer insulating layer, the planarization layer, and the pixel defining layer are stacked in sequence, and the pixel defining layer is provided with an opening. The display panel further includes a plurality of sub-pixels disposed in the opening of the pixel defining layer, a cathode disposed on the pixel defining layer and covering the sub-pixel, and a thin film encapsulation structure. The thin film encapsulation structure is disposed on the cathode. The thin film encapsulation structure or the cathode is provided with a first embedded portion. The first embedded portion is embedded in the pixel defining layer and the planarization layer and is in contact with the interlayer insulating layer.

In this way, the first embedded portion is embedded in the pixel defining layer and the planarization layer and is in contact with the interlayer insulating layer. On the one hand, the embedded structure increases the bonding force between the film layers, and on the other hand, since the interlayer insulating layer is generally made of an inorganic material, while the cathode is made of a metal material, and a bottom layer of the thin film encapsulation structure is also an inorganic encapsulation layer, the adhesion between the inorganic material and the inorganic material and the adhesion between the inorganic material and the metal material are greatly improved compared to the adhesion between the cathode made of a conventional metal material and the pixel defining layer made of a common organic material. Therefore, through the improvement of the structure and the skillful utilization of the characteristics of the materials, the adhesion between the film layers is greatly enhanced, thereby improving the problem of easy peeling between film layers due to the poor adhesion between the OLED layer and the cathode when a heavy object hits the display panel, thereby improving the impact resistance of the OLED display device, and further improving the service life and the service stability thereof.

Optionally, the first embedded portion is distributed between two adjacent sub-pixels.

Optionally, the first embedded portion is disposed around the sub-pixel.

Optionally, an outer diameter dimension of the first embedded portion gradually decreases from the pixel defining layer to the interlayer insulating layer.

Optionally, the first embedded portion includes a bottom wall in contact with the interlayer insulating layer and a sidewall in contact with the pixel defining layer and the planarization layer, and an included angle between the bottom wall and the sidewall ranges from 100° to 150°.

Optionally, the first embedded portion is in surface-to-surface contact with the interlayer insulating layer.

Optionally, the thin film encapsulation structure includes a first inorganic encapsulation layer, an organic encapsulation layer, and a second inorganic encapsulation layer stacked in sequence. The first inorganic encapsulation layer covers the cathode.

The first embedded portion is formed by at least a portion of the first inorganic encapsulation layer when the thin film encapsulation structure is provided with the first embedded portion.

Optionally, when the cathode is provided with the first embedded portion, the first embedded portion has a hollow structure, the thin film encapsulation structure is provided with a second embedded portion. The second embedded portion is filled in the hollow structure of the first embedded portion and is at least partially embedded in the pixel defining layer.

Optionally, the second embedded portion is embedded in the pixel defining layer and the planarization layer simultaneously.

A display terminal includes the aforementioned display panel.

A method of manufacturing a display panel is provided. The display layer includes an interlayer insulating layer, a planarization layer, and a pixel defining layer stacked in sequence. The method includes: defining a first through hole on the planarization layer to expose at least a portion of the interlayer insulating layer; defining an opening configured to provide a sub-pixel and a second through hole in communication with the first through hole in the pixel defining layer; providing a sub-pixel in the opening of the pixel defining layer; forming a cathode covering the sub-pixel on the pixel defining layer, and forming a thin film encapsulation structure on the cathode; during forming the thin film encapsulation structure on the cathode or during forming the cathode covering the sub-pixel, a first embedded portion made of a material of the thin film encapsulation structure or a material of the cathode is formed in the first through hole and the second through hole.

Optionally, when the first embedded portion is made of the material of the thin film encapsulation structure, after forming the cathode, the method further includes patterning a position of the cathode corresponding to the second through hole.

The forming the thin film encapsulation structure on the cathode is specifically: depositing the material of the thin film encapsulation structure on the patterned cathode and in the first through hole and the second through hole to form the thin film encapsulation structure provided with the first embedded portion.

Optionally, when the first embedded portion is made of the material of the cathode, the material of the cathode forms a hollow structure in the first through hole and the second through hole, and a second embedded portion made of the material of the thin film encapsulation structure is formed in the hollow structure of the first embedded portion.

DETAILED DESCRIPTION OF THE EMBODIMENTS

Figure 1:
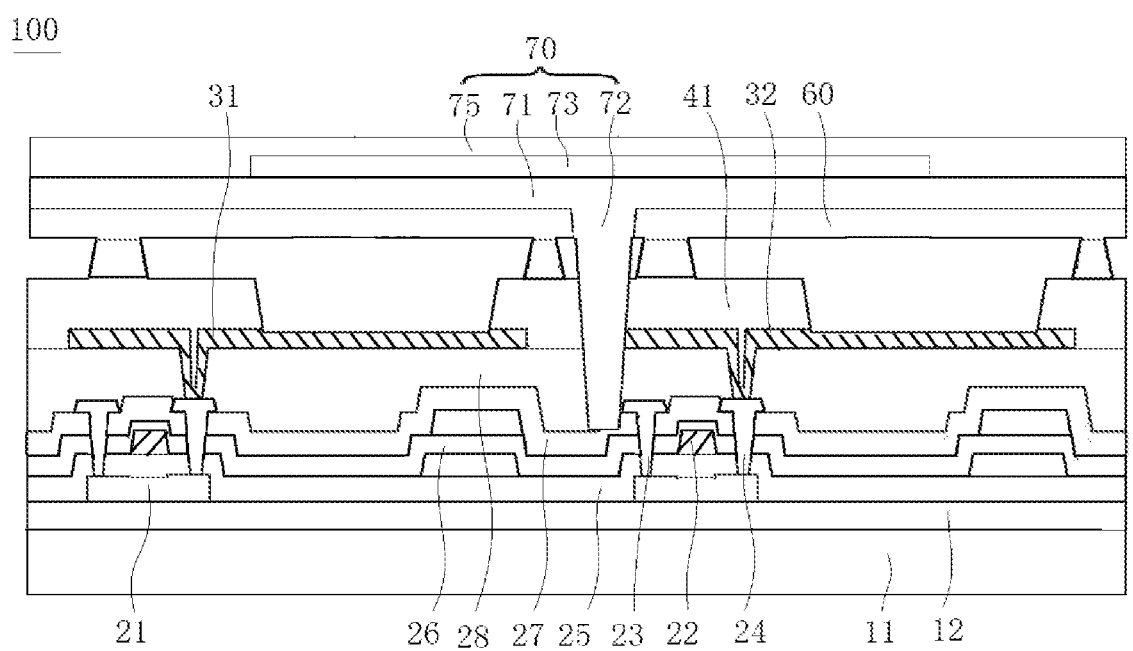
FIG. 1 is a schematic view of a display panel in accordance with an embodiment.

OLED display devices have better flexibility while being less resistant to impact due to material and structural limitations. When a heavy object hits the OLED display device, the hit area is easy to have poor display conditions such as dark spots, bright spots, colored spots, and the like, so that the service life and the stability of the OLED display device are seriously affected.

In order to facilitate the understanding of the present disclosure, the present disclosure will be described more fully hereinafter with reference to the accompanying drawings. Preferred embodiments of the present disclosure are shown in the drawings. The disclosure may, however, be embodied in many different forms and are not limited to the embodiments described herein. Rather, these embodiments are provided so as to understand contents disclosed in this disclosure more thoroughly and completely.

The present disclosure provides a display panel in accordance with an embodiment and provides a method of manufacturing the display panel.

Figure 2:
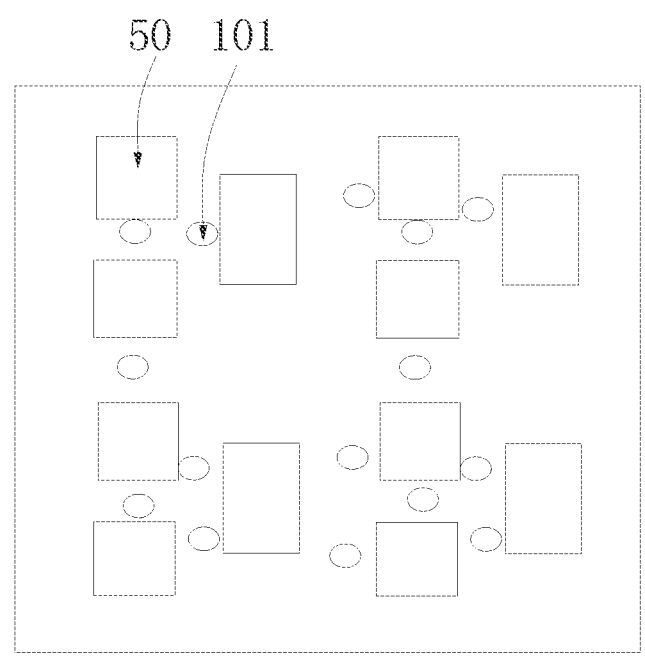
FIG. 2 is a top plan view of the display panel of FIG. 1 prior to forming a cathode.

Referring to FIGS. 1 and 2, the display panel 100 includes an array substrate, a sub-pixel 50, a cathode 60, and a thin film encapsulation structure 70. The array substrate may include a substrate 11, a buffer layer 12, a thin film transistor, and a sub-pixel electrode disposed on the thin film transistor.

The method of manufacturing the display panel 100 is as follows.

A substrate 11 is provided. The substrate 11 may be formed of a suitable material such as a glass material, a metal material, or a plastic material including polyethylene terephthalate (PET), polyethylene naphthalate (PEN), polyimide, or the like.

The substrate 11 has a first sub-pixel area, a second sub-pixel area, and a third sub-pixel area. A set of the first sub-pixel area, the second sub-pixel area, and the third sub-pixel area may constitute one pixel area. In one embodiment, the substrate 11 may have a plurality of pixel areas, and in each of the pixel areas, the first sub-pixel area may be a sub-pixel area emitting red light, the second sub-pixel area may be a sub-pixel area emitting green light, and the third sub-pixel area may be a sub-pixel area emitting blue light.

In alternative embodiments, each of the pixel areas may also include other sub-pixel areas, for example, a fourth sub-pixel area emitting white light, which is not limited herein.

A thin film transistor (TFT) may be disposed on the substrate 11. In one embodiment, an additional layer such as a buffer layer 12 may be formed on the substrate 11 prior to forming the TFT. The buffer layer 12 may be formed on the entire surface of the substrate 11, or may be formed by being patterned.

The buffer layer 12 may have a suitable material including PET, PEN, polyacrylate, and/or polyimide, and the like, and may form a layered structure in a form of a single layer or a multilayer stack. The buffer layer 12 may also be formed of silicon oxide or silicon nitride, or may include a composite layer of an organic material and/or an inorganic material.

The TFT may control the emission of each sub-pixel, or may control the amount of emission when each sub-pixel emits light. The TFT may include a semiconductor layer 21, a gate electrode 22, a source electrode 23, and a drain electrode 24.

The semiconductor layer 21 may be formed of an amorphous silicon layer, a metal oxide or a polysilicon layer, or may be formed of an organic semiconductor material. In one embodiment, the semiconductor layer 21 includes a channel region, and a source region and a drain region doped with dopants.

The semiconductor layer 21 may be covered with a gate insulating layer 25. The gate electrode 22 may be disposed on the gate insulating layer 25. In general, the gate insulating layer 25 may cover the entire surface of the substrate 11. In one embodiment, the gate insulating layer 25 may be formed by patterning. The gate insulating layer 25 may be formed of silicon oxide, silicon nitride, or other insulating organic or inorganic material in consideration of adhesion to an adjacent layer, formability of a stacked target layer, and surface flatness. The gate electrode 22 may be directly covered by the interlayer insulating layer 27. In some embodiments, a capacitive insulating dielectric layer 26 may be formed on the gate electrode 22, and then the interlayer insulating layer 27 may be covered thereon.

Generally, the interlayer insulating layer 27 is formed of silicon oxide, silicon nitride, and/or other suitable insulating inorganic materials. Specifically, hydrogen-containing ions generated during the preparation of the interlayer insulating layer 27 enter the gate insulating layer 25 and the channel region to neutralize film defects, thereby functioning as passivation and insulation. Specifically, in one embodiment, the interlayer insulating layer 27 is a stack of silicon nitride and silicon oxide.

A portion of the gate insulating layer 25 and the interlayer insulating layer 27 may be removed, and a contact hole is formed after the removal to expose a predetermined area of the semiconductor layer 21. The source electrode 23 and the drain electrode 24 may be in contact with the semiconductor layer 21 via the contact hole. In consideration of conductivity, the source electrode 23 and the drain electrode 24 may be formed of a single material layer or a composite material layer including at least one material of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) or other suitable alloys.

Since the TFT has a complicated layer structure, it is necessary to form a planarization layer 28 on the TFT in order to form a sufficiently flat top surface. After the planarization layer 28 is formed, an electrode through hole may be formed in the planarization layer 28 to expose the drain electrode 24 of the TFT.

In the course of research, the present inventor discovers that, in a falling ball reliability test of a soft screen, when a steel ball hits the screen, the hit area cannot be displayed in full color instantly, and the display area has poor display problems such as dark spots, bright spots, colored spots, and the like. Then, it is found through a lot of researches that this is mainly because the stress concentration cannot be dispersed at the moment when the heavy object hit, resulting in damage to the elements. A quite important reason is that peeling easily occurs between the film layers having poor adhesion when the falling ball hits the panel, and the OLED layer and the cathode are most easily peeled off.

Referring to FIG. 1 and FIG. 2, based on this, the present disclosure is further provided with a first through hole 101 in the planarization layer 28 to expose at least a portion of the interlayer insulating layer 27, thereby facilitating a contact of a cathode material for subsequently forming the cathode 60 or a thin film encapsulation material for forming the thin film encapsulation structure 70 with the interlayer insulating layer 27. The interlayer insulating layer 27 can be provided with a gap at a position corresponding to the first through hole 101, that is, the cathode material or the thin film encapsulation material is also embedded in the interlayer insulating layer 27. Considering the complexity of the manufacturing process and defects that may be caused by providing the gap in the interlayer insulating layer 27, it is preferred that the cathode material or the thin film encapsulation material is directly in contact with a top surface of the interlayer insulating layer 27.

In addition, the first through hole 101 is preferably provided to avoid the source electrode 23 and the drain electrode 24, thereby avoiding damaging and exposing the source electrode 23 and the drain electrode 24. Moreover, the first through holes 101 are distributed between adjacent two openings for providing the sub-pixels 50 in order to better protect the sub-pixels 50. Specifically, in the present embodiment, the first through hole 101 has a shape of a circular hole, and specifically may be in a shape of regular circular, elliptical, square, or the like. The shape of the first through hole 101 is not limited thereto.

Figure 3:
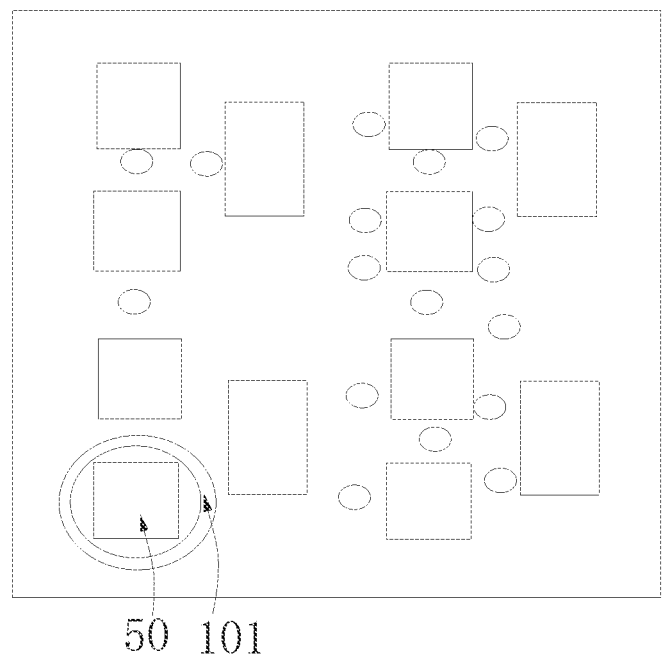
FIG. 3 is a top plan view of a display panel in accordance with another embodiment prior to forming a cathode.

Referring to FIG. 3, in alternative embodiments, the first through hole 101 is disposed around the sub-pixel 50. In addition, a plurality of first through holes 101 may be disposed around the periphery of the sub-pixel 50 to form a surrounding shape, or the first through holes 101 may be annular holes themselves and disposed around the sub-pixel 50, so as to better enhance the impact resistance strength at the sub-pixel 50. It can be understood that, in the same embodiment, there are a plurality of sub-pixels 50, in which a portion of the sub-pixels 50 may be surrounded by the plurality of first through holes 101, and a portion of the sub-pixels 50 may be surrounded by the first through holes 101 which are annular holes.

The annular hole here is not limited to have a circular annular shape, and may also have a square annular shape as long as it forms a closed annular structure hole. When there are the plurality of first through holes 101 and the first through holes 101 are annular holes, one of the first through holes 101 may be located in the other first through hole 101.

In addition, preferably, the cathode material or the thin film encapsulation material is in surface-to-surface contact with the interlayer insulating layer 27, so as to increase a contact area between the cathode material or the thin film encapsulation material and the interlayer insulating layer 27, thereby improving the adhesion between the cathode material or the thin film encapsulation material and the interlayer insulating layer 27. Therefore, the problem of easy peeling between film layers due to poor adhesion between the OLED layer and the cathode 60 when the heavy object hits the display panel is improved, thereby contributing to improving the impact resistance of the OLED display device.

Then, a first sub-pixel electrode 31, a second sub-pixel electrode 32, and a third sub-pixel electrode (not shown) are formed on the planarization layer 28. The first sub-pixel electrode 31 is formed in the first pixel area. The second sub-pixel electrode 32 is formed in the second sub-pixel area. The third sub-pixel electrode is formed in the third sub-pixel area. Here, the first sub-pixel electrode 31, the second sub-pixel electrode 32, and the third sub-pixel electrode may be formed simultaneously or synchronously. Each of the first sub-pixel electrode 31, the second sub-pixel electrode 32, and the third sub-pixel electrode may be electrically coupled to the TFT through the electrode through hole. Here, the first sub-pixel electrode 31, the second sub-pixel electrode 32, and the third sub-pixel electrode are generally referred to as anodes.

Each of the first sub-pixel electrode 31, the second sub-pixel electrode 32, and the third sub-pixel electrode may form a transparent electrode (transflective) or a reflective electrode. When the first sub-pixel electrode 31, the second sub-pixel electrode 32, and the third sub-pixel electrode form a transparent electrode (transflective), the first sub-pixel electrode 31, the second sub-pixel electrode 32, and the third sub-pixel electrode may be formed of indium tin oxide (ITO), indium zinc oxide (IZO), zinc oxide (ZnO), indium oxide ($In_2O_3$), indium gallium oxide (IGO), or aluminum zinc oxide (AZO). Here, the structures and materials of the first sub-pixel electrode 31, the second sub-pixel electrode 32, and the third sub-pixel electrode are not limited thereto.

After forming the first sub-pixel electrode 31, the second sub-pixel electrode 32, and the third sub-pixel electrode, referring to FIG. 1, a pixel defining layer 41 (PDL) may be formed. The formed pixel defining layer 41 covers the first sub-pixel electrode 31, the second sub-pixel electrode 32, and the third sub-pixel electrode at the same time. The pixel defining layer 41 may be used to define the sub-pixels by opening an opening corresponding to each of the sub-pixels. The sub-pixel 50 is disposed in the opening of the pixel defining layer 41. The pixel defining layer 41 is typically formed of a single material layer or a composite material layer of suitable organic materials among materials such as polyacrylate, polyimide, and the like.

With continued reference to FIG. 1 and FIG. 2, a second through hole in communication with the first through hole 101 is further formed on the pixel defining layer 41 to facilitate the contact of the cathode material or the thin film encapsulation material with the interlayer insulating layer 27. The first through hole 101 may be formed by patterning after the interlayer insulating layer 27 is formed, and the second through hole may also be formed by patterning after the pixel defining layer 41 is formed. In alternative embodiments, the first through hole 101 and the second through hole may be formed by one punching after the interlayer insulating layer 27 and the pixel defining layer 41 are formed. The arrangement of the openings and the second through holes on the pixel defining layer 41 is also not limited in a specific order, and the arrangement of the sub-pixels 50 and the second through holes is also not limited in a specific order.

The outer diameter dimensions of the second through hole and the first through hole 101 gradually decrease from the pixel defining layer 41 to the interlayer insulating layer 27 in consideration of the process difficulty of providing the through holes or the continuity of materials deposited in the first through hole 101 and the second through hole. An included angle between a sidewall of an embedded hole formed by the second through hole and the first through hole 101 and a surface of the interlayer insulating layer 27 in contact therewith ranges from 100° to 150°, and in this angle range, it is convenient to deposit on the surface of the interlayer insulating layer 27 and the sidewall of the embedded hole to form a continuous material layer.

The pixel defining layer 41 may be formed in such a manner that the pixel defining layer 41 is formed throughout the planarization layer 28 of the substrate 11 using a material suitable for the pixel defining layer 41, to cover the first sub-pixel electrode 31, the second sub-pixel electrode 32, and the third sub-pixel electrode. Then, the pixel defining layer 41 is patterned to expose central portions of the first sub-pixel electrode 31, the second sub-pixel electrode 32, and the third sub-pixel electrode.

The luminescent material may be evaporated to form the sub-pixel 50. The evaporation material covers a portion of the first sub-pixel electrode 31 which is not covered by the pixel defining layer 41, covers a portion of the second sub-pixel electrode 32 which is not covered by the pixel defining layer 41, and covers a portion of the third sub-pixel electrode which is not covered by the pixel defining layer 41.

Then, the cathode 60 covering the first sub-pixel area, the second sub-pixel area, and the third sub-pixel area is formed on the pixel defining layer 41 by evaporation. The cathode 60 may be integrally formed with respect to the plurality of sub-pixels to cover the entire display area. The cathode 60 is also commonly referred to as a counter electrode.

The thin film encapsulation structure 70 is formed on the cathode 60. The thin film encapsulation structure 70 includes a first inorganic encapsulation layer 71, an organic encapsulation layer 73, and a second inorganic encapsulation layer 75 stacked in sequence, and the first inorganic encapsulation layer 71 covers the cathode. The structure of the thin film encapsulation structure 70 is not limited thereto, and may further include a third inorganic encapsulation layer laminated on the second inorganic encapsulation layer 75 and another organic encapsulation layer disposed between the second inorganic encapsulation layer and the third inorganic encapsulation layer.

Specifically, the first inorganic encapsulation layer 71 and the second inorganic encapsulation layer 75 are silicon nitride films or silicon dioxide films. The first inorganic encapsulation layer 71 and the second inorganic encapsulation layer 75 may be formed by a chemical vapor deposition method. The organic encapsulation layer 73 may be formed using ink-jet printing. Specifically, the organic encapsulation layer 73 may be an acrylate film, and the material of the organic encapsulation layer 73 is not limited thereto.

With continued reference to FIG. 1, since the planarization layer 28 is provided with the first through hole 101 and the pixel defining layer 41 is provided with the second through hole in communication with the first through hole 101, a first embedded portion 72 (referring to FIG. 1) made of the material of the thin film encapsulation structure 70 is formed in the first through hole 101 and the second through hole during forming the thin film encapsulation structure 70 on the cathode 60.

Since the cathode 60 is located between the pixel defining layer 41 and the thin film encapsulation structure 70, the structure in which the thin film encapsulation structure 70 is provided with the first embedded portion 72 also protects the cathode 60 while enhancing the bonding force between the thin film encapsulation structure 70 and the pixel defining layer 41, thereby improving the problem of easy peeling between film layers due to the poor adhesion between the OLED layer and the cathode 60 when the heavy object hits the display panel, and improving the impact resistance of the OLED display device.

When the first embedded portion 72 is made of the material of the thin film encapsulation structure 70, after the cathode 60 is formed, a step of patterning a position of the cathode 60 corresponding to the second through hole to form a via hole is further included. The formed via hole is patterned to facilitate deposition of the material of the thin film encapsulation structure 70 in the first through hole 101 and the second through hole through the cathode.

Accordingly, the step of forming the thin film encapsulation structure 70 on the cathode 60 is specifically as follows: depositing the material of the thin film encapsulation structure 70 on the patterned cathode 60 and in the first through hole 101 and the second through hole to form the thin film encapsulation structure 70 provided with the first embedded portion 72. Thus, the thin film package structure 70 is in direct contact with the interlayer insulating layer 27, and the adhesion between the thin film encapsulation structure 70 with the inorganic encapsulation layer as the outer layer and the interlayer insulating layer 27 is strong, so that the bonding force between the film layers is greatly improved.

Specifically, in the present embodiment, when the first embedded portion 72 is formed in the thin film encapsulation structure 70, the first embedded portion 72 is formed of a first inorganic encapsulation material deposited in the first through hole 101 and the second through hole. In addition, a top surface of the first inorganic encapsulation layer 71 formed of the first inorganic encapsulation material is substantially flush. The structure of the first embedded portion 72 is not limited thereto, and in alternative embodiments, the first embedded portion 72 is formed of an organic encapsulation material and/or a second inorganic encapsulation material deposited on the first inorganic encapsulation material in addition to the first inorganic encapsulation material. In other words, the first embedded portion 72 is formed at least by the first inorganic encapsulation layer 71 deposited in the first through hole 101 and the second through hole.

In some embodiments, when hole diameters of the first through hole 101 and the second through hole are larger or the overall thickness of the thin film encapsulation structure 70 is smaller, an upper surface of the first embedded portion 72 of the thin film encapsulation structure 70 formed in the first through hole 101 and the second through hole is not flush with other positions, that is, the first embedded portion 72 has a hollow structure recessed toward the substrate 11.

Figure 4:
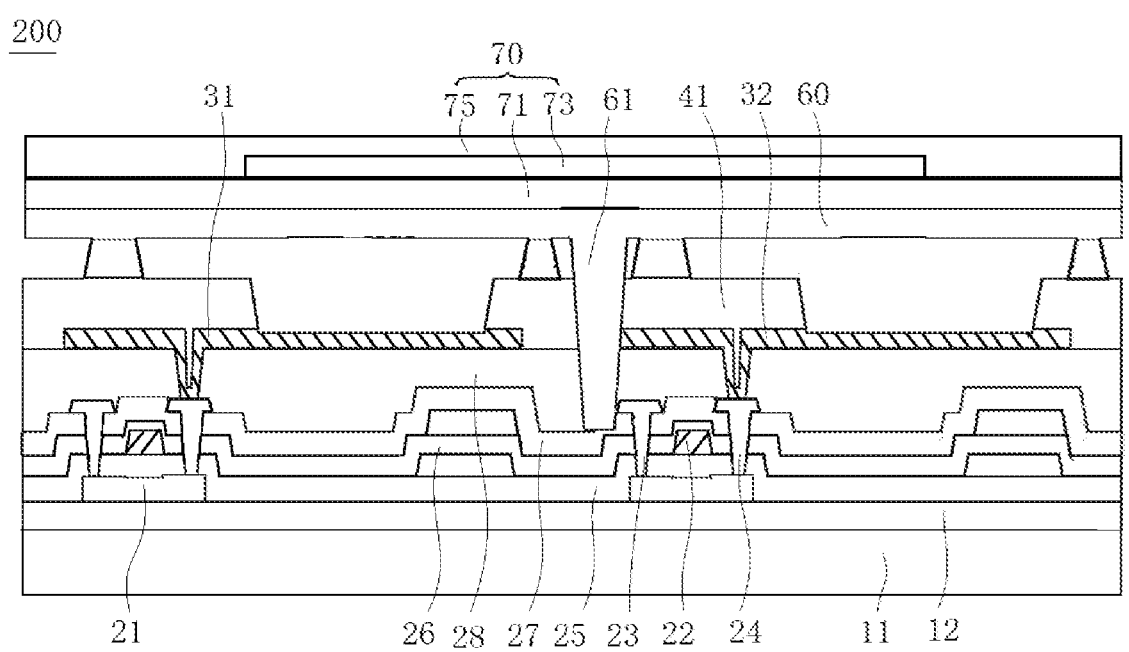
FIG. 4 is a schematic view of a display panel in accordance with another embodiment.

Referring to FIG. 4, in a display panel 200 in accordance with other embodiments, based on the same inventive concept, since the planarization layer 28 is provided with a first through hole and the pixel defining layer 41 is provided with a second through hole in communication with the first through hole, during forming the cathode 60 covering the sub-pixel 50, a first embedded portion 61 made of a material of the cathode 60 is formed in the first through hole and the second through hole.

The structure in which the cathode 60 is provided with the first embedded portion 61 enhances the bonding force between the cathode 60 and the pixel defining layer 41, thereby improving the problem of easy peeling between film layers due to the poor adhesion between the OLED layer and the cathode 60 when the heavy object hits the display panel, and improving the impact resistance of the OLED display device.

Specifically, in the present embodiment, the first embedded portion 61 is made of the material of the cathode 60 and fills the entire first through hole and the entire second through hole.

Figure 5:
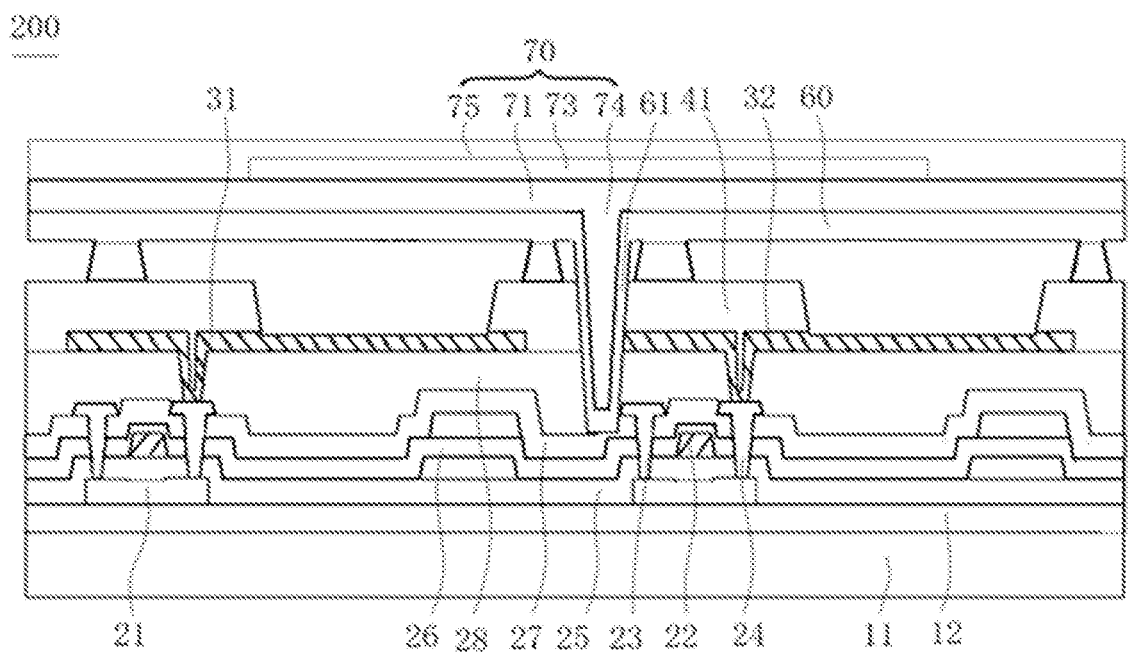
FIG. 5 is a schematic view of a first embedded portion of the display panel of FIG. 4 in accordance with still another embodiment.

Referring to FIG. 5, a structure of the first embedded portion 61 in accordance with another embodiment when the first embedded portion 61 is made of the material of the cathode 60 is provided.

A first embedded portion 61 having a hollow structure is formed in the first through hole and the second through hole, and a second embedded portion 74 made of the material of the thin film encapsulation structure 70 is formed in the hollow structure of the first embedded portion 61. In other words, the first embedded portion 61 has a hollow structure, which at least does not completely fill the second through hole, and the second embedded portion 74 is filled in the hollow structure of the first embedded portion 61 and is at least partially embedded in the pixel defining layer 41. The first embedded portion 61 is in direct contact with the interlayer insulating layer 27, and the second embedded portion 74 is not in direct contact with the interlayer insulating layer 27.

By providing the first embedded portion 61 made of the material of the cathode 60 in this way, on the one hand, the bonding force between the cathode 60 and the interlayer insulating layer 27 is improved, thereby improving the adhesion between the cathode 60 and the OLED layer, and on the other hand, the bonding force between the thin film encapsulation structure 70 and the cathode 60 is also improved, thereby cooperatively improving the impact resistance of the OLED display device.

Specifically, in the present embodiment, the first embedded portion 61 also does not completely fill the first through hole, that is, the hollow portion of the first embedded portion 61 extends through the first through hole and the second through hole, and the second embedded portion 74 is formed in the hollow structure of the first embedded portion 61, so as to fill the first through hole and the second through hole together with the first embedded portion 61. In other words, the first embedded portion 61 is simultaneously embedded in the pixel defining layer 41 and the planarization layer 28, and is in direct contact with the pixel defining layer 41 and the planarization layer 28, while the second embedded portion 74 is simultaneously embedded in the pixel defining layer 41 and the planarization layer 28, but is not in direct contact with the pixel defining layer 41 and the planarization layer 28.

The second embedded portion 74 of the present embodiment may be formed of the same material as that of the first embedded portion 61, and are not described in detail herein. Other structures of the display panel 200 are substantially similar to those of the display panel 100, and are not described in detail herein.

In summary, the first embedded portion 72/61 of the display panel 100/200 is embedded in the pixel defining layer 41 and the planarization layer 28 and is in contact with the interlayer insulating layer 27. On the one hand, the embedded structure increases the bonding force between the film layers, and on the other hand, since the interlayer insulating layer 27 is generally made of the inorganic material, while the cathode 60 is made of the metal material, and a bottom layer of the thin film encapsulation structure 70 is also the inorganic encapsulation layer, the adhesion between the inorganic material and the inorganic material and the adhesion between the inorganic material and the metal material are greatly improved compared to the adhesion between the cathode 60 made of a conventional metal material and the pixel defining layer 41 made of a common organic material. Therefore, through the improvement of the structure and the skillful utilization of the characteristics of the materials, the adhesion between the film layers is greatly enhanced, thereby improving the problem of easy peeling between film layers due to the poor adhesion between the OLED layer and the cathode 60 when the heavy object hits the display panel, and improving the impact resistance of the OLED display device.

The first embedded portion 72/61 includes a bottom wall in contact with the interlayer insulating layer 27 and a sidewall in contact with the pixel defining layer 41 and the planarization layer 28. The bottom wall of the first embedded portion 72/61 is attached to the bottom wall of the embedded hole, and the sidewall of the first embedded portion 72/61 is attached to the sidewall of the embedded hole.

With continued reference to FIG. 1, FIG. 4, or FIG. 5, a display panel 100/200 in accordance with an embodiment can be manufactured by the aforementioned method, and includes an interlayer insulating layer 27, a planarization layer 28, and a pixel defining layer 41 stacked in sequence. The pixel defining layer 41 is provided with an opening for providing a sub-pixel 50.

The display panel 100/200 further includes the sub-pixel 50, a cathode 60, and a thin film encapsulation structure 70. The sub-pixel 50 is disposed in the opening of the pixel defining layer 41.

The cathode 60 is disposed on the pixel defining layer 41 and covers the sub-pixel 50. The thin film encapsulation structure 70 is disposed on the cathode 60. The thin film encapsulation structure 70 or the cathode 60 is provided with a first embedded portion 72/61, and the first embedded portion 72/61 is embedded in the pixel defining layer 41 and the planarization layer 28 and is in contact with the interlayer insulating layer 27.

With continued reference to FIG. 2, the positions of the first embedded portions 72/61 are distributed corresponding to the positions of the first through holes 101 and the second through holes, that is, the first embedded portions 72/61 are distributed between two adjacent sub-pixels 50. In alternative embodiments, the first embedded portion 72/61 is disposed around the sub-pixel 50. With continued reference to FIG. 3, in addition, a plurality of first embedded portions 72/61 may be disposed around the periphery of the sub-pixel 50 to form a surrounding shape, or one first embedded portion 72/61 may be provided in an annular shape so as to surround the sub-pixel 50, so as to better enhance the impact resistance strength at the sub-pixel 50.

In the same embodiment, there are a plurality of sub-pixels 50, in which a portion of the sub-pixels 50 may be surrounded by the plurality of first embedded portion 72/61, and a portion of the sub-pixels 50 may be surrounded by the first embedded portion 72/61 which are annular holes.

In some embodiments, the outer diameter dimension of the first embedded portion 72/61 gradually decrease from the pixel defining layer 41 to the interlayer insulating layer 27. When the first embedded portion 72/61 is annular, the outer diameter dimension refers to a ring width, i.e., a difference between a radius of an outer ring and a radius of an inner ring of the ring. In addition, the first embedded portion 72/61 includes a bottom wall in contact with the interlayer insulating layer 27 and a sidewall in contact with the pixel defining layer 41 and the planarization layer 28, and an included angle between the bottom wall and the sidewall ranges from 100° to 150°.

Optionally, the thin film encapsulation structure 70 includes a first inorganic encapsulation layer 71, an organic encapsulation layer 73, and a second inorganic encapsulation layer 75 stacked in sequence. The first inorganic encapsulation layer 71 covers the cathode. The first embedded portion 72 is formed by at least a portion of the first inorganic encapsulation layer 71 when the thin film encapsulation structure 70 is provided with the first embedded portion 72. Here, the portion of the first inorganic encapsulation layer 71 refers to the first inorganic encapsulation layer 71 deposited in the first through hole and the second through hole. The structure of the first embedded portion 72 is not limited thereto. In alternative embodiments, the first embedded portion 72 is further formed of an organic encapsulation material and/or a second inorganic encapsulation material deposited on the first inorganic encapsulation material.

In the manufacturing method, the cathode material or the thin film encapsulation material is in surface-to-surface contact with the interlayer insulating layer 27, so as to increase the contact area between the cathode material or the thin film encapsulation material and the interlayer insulating layer. Accordingly, the first embedded portion 72/61 is in surface-to-surface contact with the interlayer insulating layer.

When the interlayer insulating layer 27 is provided with a gap at a position corresponding to the first through hole, the first embedded portion 72/61 is engaged with the gap, that is, the first embedded portion 72/61 is embedded in the interlayer insulating layer 27.

The display panel 100/200 may be manufactured by the aforementioned manufacturing method, and other structural features will not described in detail again. Through the improvement of the structure and the skillful utilization of the characteristics of the materials, the display panel 100/200 greatly enhances the adhesion between the film layers, thereby improving the problem of easy peeling between film layers due to the poor adhesion between the OLED layer and the cathode 60 when the heavy object hits the display panel, and improving the impact resistance of the OLED display device.

Based on the same inventive concept, a display terminal is further provided in accordance with an embodiment of the present disclosure, which includes the aforementioned display panel 100/200. In some embodiments, the display terminal may be a television, a tablet computer, a mobile phone, or the like.

In some embodiments, the display terminal includes the display panel 100/200 and a control unit, or called as a control circuit, configured to transmit a display signal to the display panel.

The display terminal adopts the aforementioned display panel 100/200, which improves the problem of easy peeling between film layers due to the poor adhesion between the OLED layer and the cathode when the heavy object hits the display panel, thereby improving the impact resistance of the OLED display device.

Although the respective exemplary embodiments have been described one by one, it shall be appreciated that the respective exemplary embodiments will not be isolated. Those skilled in the art can apparently appreciate upon reading the disclosure of this application that the respective technical features involved in the respective exemplary embodiments can be combined arbitrarily between the respective exemplary embodiments as long as they have no collision with each other. Of course, the respective technical features mentioned in the same exemplary embodiment can also be combined arbitrarily as long as they have no collision with each other.

The foregoing descriptions are merely specific exemplary embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure. Therefore, the protection scope of the present disclosure shall be subject to the protection scope of the appended claims.

The invention claimed is:

1. A display panel, comprising:
   an interlayer insulating layer;
   a planarization layer;
   a pixel defining layer, the interlayer insulating layer, the planarization layer, and the pixel defining layer being stacked in sequence, and the pixel defining layer comprising an opening;
   a plurality of sub-pixels disposed in the opening of the pixel defining layer;
   a cathode disposed on the pixel defining layer and covering the sub-pixel;
   a thin film encapsulation structure disposed on the cathode, the thin film encapsulation structure or the cathode being provided with a first embedded portion, the first embedded portion being embedded in the pixel defining layer and the planarization layer and being in contact with the interlayer insulating layer; and
   wherein when the cathode is provided with the first embedded portion, the first embedded portion has a hollow structure, the thin film encapsulation structure is provided with a second embedded portion, and the second embedded portion is filled in the hollow structure of the first embedded portion and is at least partially embedded in the pixel defining layer.

2. The display panel of claim 1, wherein the first embedded portion is distributed between two adjacent sub-pixels.

3. The display panel of claim 1, wherein the first embedded portion is disposed around the sub-pixel.

4. The display panel of claim 1, wherein an outer diameter dimension of the first embedded portion gradually decreases from the pixel defining layer to the interlayer insulating layer.

5. The display panel of claim 4, wherein the first embedded portion comprises a bottom wall in contact with the interlayer insulating layer and a sidewall in contact with the pixel defining layer and the planarization layer.

6. The display panel of claim 5, wherein an included angle between the bottom wall and the sidewall ranges from 100° to 150°.

7. The display panel of claim 1, wherein the first embedded portion is in surface-to-surface contact with the interlayer insulating layer.

8. The display panel of claim 1, wherein the thin film encapsulation structure comprises a first inorganic encapsulation layer, an organic encapsulation layer, and a second inorganic encapsulation layer stacked in sequence, and the first inorganic encapsulation layer covers the cathode;
   the first embedded portion is formed by at least a portion of the first inorganic encapsulation layer when the thin film encapsulation structure is provided with the first embedded portion.

9. The display panel of claim 1, wherein the second embedded portion is embedded in the pixel defining layer and the planarization layer simultaneously.

10. A display terminal comprising a display panel of claim 1.

11. A method of manufacturing a display panel, wherein the display panel comprises an interlayer insulating layer, a planarization layer, and a pixel defining layer stacked in sequence, and the method comprises:
- defining a first through hole on the planarization layer to expose at least a portion of the interlayer insulating layer;
- defining an opening configured to provide a sub-pixel and a second through hole in communication with the first through hole in the pixel defining layer;
- providing a sub-pixel in the opening of the pixel defining layer;
- forming a cathode covering the sub-pixel on the pixel defining layer, and forming a thin film encapsulation structure on the cathode; and
- wherein during forming the thin film encapsulation structure on the cathode or during forming the cathode covering the sub-pixel, a first embedded portion made of a material of the thin film encapsulation structure or a material of the cathode is formed in the first through hole and the second through hole.

12. The method of claim 11, wherein when the first embedded portion is made of the material of the thin film encapsulation structure, after forming the cathode, the method further comprises patterning a position of the cathode corresponding to the second through hole;
the forming the thin film encapsulation structure on the cathode is specifically: depositing the material of the thin film encapsulation structure on the patterned cathode and in the first through hole and the second through hole to form the thin film encapsulation structure provided with the first embedded portion.

13. The method of claim 12, wherein when the first embedded portion is made of the material of the cathode, the material of the cathode forms a hollow structure in the first through hole and the second through hole, and a second embedded portion made of the material of the thin film encapsulation structure is formed in the hollow structure of the first embedded portion.

14. The method of claim 13, wherein the first through hole is a circular hole, an elliptical hole, a square hole, or an annular hole.

15. The method of claim 14, wherein when there are a plurality of first through holes and the first through holes are annular holes, one of the first through holes is located in the other first through hole,
- an interlayer insulating layer;
- a planarization layer;
- a pixel defining layer, the interlayer insulating layer, the planarization layer, and the pixel defining layer being stacked in sequence, and the pixel defining layer comprising an opening; a plurality of sub-pixels disposed in the opening of the pixel defining layer;
- a cathode disposed on the pixel defining layer and covering the sub-pixel;
- a thin film encapsulation structure disposed on the cathode, the thin film encapsulation structure or the cathode being provided with a first embedded portion, the first embedded portion being embedded in the pixel defining layer and the planarization layer and being in contact with the interlayer insulating layer.

16. A display panel comprising:
- an interlayer insulating layer;
- a planarization layer;
- a pixel defining layer stacked in sequence;
- a first through hole configured on the planarization layer to expose at least a portion of the interlayer insulating layer;
- an opening comprising a second through hole in communication with the first through hole in the pixel defining layer;
- a subpixel configured in the opening, the second through hole being configured to provide impact resistance for the subpixel;
- a cathode overlaying the sub-pixel on the pixel defining layer; and
- a thin film encapsulation structure positioned on the cathode.

17. The display panel of claim 16 further comprising an embedding material configured with the first through hole and the second through hole.

18. The display panel of claim 16 wherein the first through is characterized by a circular shape, an elliptical shape, a square shape, or an annular shape.

19. The display panel of claim 16 further comprising:
- a cathode positioned on the pixel defining layer;
- a thin film encapsulation structure configured on the cathode.

20. The display panel of claim 19 wherein thin film encapsulation structure comprises an embedded portion configured at the pixel defining layer.

* * * * *